(12) United States Patent
Gu et al.

(10) Patent No.: US 8,796,140 B1
(45) Date of Patent: Aug. 5, 2014

(54) HYBRID CONDUCTOR THROUGH-SILICON-VIA FOR POWER DISTRIBUTION AND SIGNAL TRANSMISSION

(71) Applicant: International Business Machines Corporation, Armonk, NY (US)

(72) Inventors: Xiaoxiong Gu, White Plains, NY (US); Michael Mcallister, New Milford, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/962,581

(22) Filed: Aug. 8, 2013

Related U.S. Application Data

(63) Continuation of application No. 13/741,947, filed on Jan. 15, 2013.

(51) Int. Cl.
*H01L 21/44* (2006.01)
*H01L 21/768* (2006.01)

(52) U.S. Cl.
CPC ............................. *H01L 21/76898* (2013.01)
USPC ........... 438/667; 438/629; 438/637; 438/639; 438/640; 438/672

(58) Field of Classification Search
CPC ............... H01L 21/76898; H01L 2225/06541; H01L 2225/06551
USPC ......... 438/109, 629, 637, 639, 640, 667, 668, 438/672, 675, 700, 701, 713, 978
See application file for complete search history.

(56) References Cited

U.S. PATENT DOCUMENTS

| | | | |
|---|---|---|---|
| 6,388,208 B1 | 5/2002 | Kiani et al. | |
| 6,770,822 B2 | 8/2004 | Pasternak et al. | |
| 7,129,567 B2 | 10/2006 | Kirby | |
| 7,183,653 B2 | 2/2007 | Myers et al. | |
| 7,239,222 B2 | 7/2007 | Nagaishi et al. | |
| 7,282,784 B2 | 10/2007 | Kirby et al. | |
| 7,456,364 B2 | 11/2008 | Knighten et al. | |
| 7,843,036 B2 | 11/2010 | Block et al. | |

(Continued)

OTHER PUBLICATIONS

Office Action dated Oct. 22, 2013 received in a related U.S. Appl. No. 13/741,947.

*Primary Examiner* — Jarrett Stark
*Assistant Examiner* — Mohammad M Hoque
(74) *Attorney, Agent, or Firm* — Scully Scott Murphy & Presser PC; Anne V. Dougherty, Esq.

(57) ABSTRACT

A method of providing signal, power and ground through a through-silicon-via (TSV), and an integrated circuit chip having a TSV that simultaneously provides signal, power and ground. In one embodiment, the method comprises forming a TSV through a semiconductor substrate, including forming a via in the substrate; and forming a multitude of conductive bars in the via. The multitude of conductive bars include at least one signal bar, at least one power bar, and at least one ground bar. The method further comprises connecting the at least one power bar to a power voltage source to apply power through the TSV; connecting the at least one ground bar to a ground voltage; and connecting the at least one signal bar to a source of an electronic signal to conduct the signal through the TSV and to form a hybrid power-ground-signal TSV in the substrate.

10 Claims, 10 Drawing Sheets

(56) References Cited

U.S. PATENT DOCUMENTS

| | | |
|---|---|---|
| 2006/0081396 A1 | 4/2006 | Hsu |
| 2010/0308435 A1 | 12/2010 | Nowak et al. |
| 2011/0042795 A1* | 2/2011 | Knickerbocker ............. 257/686 |
| 2011/0095435 A1 | 4/2011 | Volant et al. |
| 2012/0034759 A1* | 2/2012 | Sakaguchi et al. ............ 438/458 |
| 2013/0009322 A1* | 1/2013 | Conn et al. .................... 257/774 |
| 2013/0246990 A1 | 9/2013 | Yen et al. |

* cited by examiner

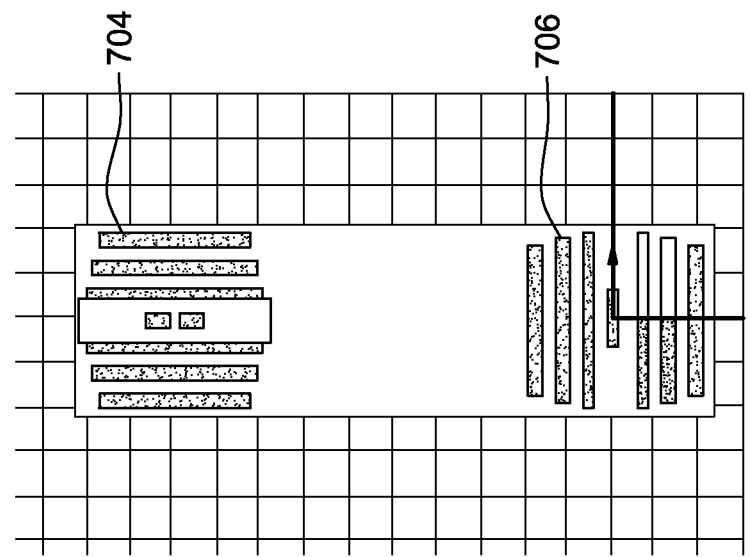
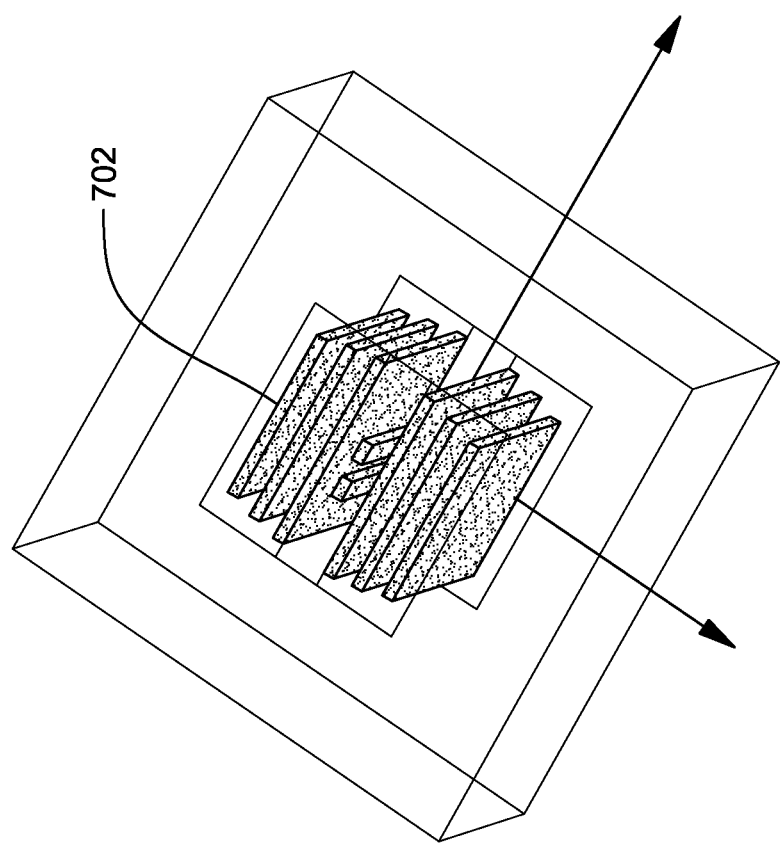
FIG. 7

US 8,796,140 B1

HYBRID CONDUCTOR THROUGH-SILICON-VIA FOR POWER DISTRIBUTION AND SIGNAL TRANSMISSION

CROSS-REFERENCE TO RELATED APPLICATION

This application is a continuation of copending application Ser. No. 13/741,947, filed Jan. 15, 2013, the entire contents and disclosure of which are hereby incorporated herein by reference.

BACKGROUND OF THE INVENTION

This invention relates generally to three dimensional silicon integrated structures, and more specifically to the design and layout of through-silicon via (TSV) structures.

In recent years the development of three dimensional IC and silicon packaging (Si3D) has been proposed with through-silicon via (TSV) technology to enable the joining of multiple silicon chips and or wafers together that are mounted on a 2nd-level package.

In semiconductor technologies, a through-silicon via, also known as a through-substrate via, is a conductive feature formed in a semiconductor substrate (wafer or die). The TSV feature vertically passes through the semiconductor substrate, providing a stacked wafer/die packaging method and allowing electrical connection between circuits in separate wafers or chips.

There are a number of ways to create a TSV. Typically, a hole is etched into, and sometimes through, the semiconductor substrate, and the hole may then be lined with various isolating layers and/or various metal layers. The hole is then filled with the conductive material, typically copper (Cu), which becomes the major part of a TSV. Some TSV's are in electrical contact with the semiconductor substrate, while others are electrically isolated. Any material within the etched hole may be considered part of the TSV, so the complete TSV may include the Cu, plus a liner, and perhaps insulating layers. Initially, the hole may not extend through the complete depth of the wafer. One side of the wafer is then subject to a thinning process (e.g. mechanical grinding, chemical-mechanical-polishing (CMP), or chemical or plasma etching) until the conductive metal of the TSV extends all the way through the semiconductor substrate. This side of the semiconductor substrate may be referred to as the grind side. The opposite side, where devices and the interconnect structure are located, may be referred to as the device side.

BRIEF SUMMARY

Embodiments of the invention include a method of providing signal, power and ground by way of a through-silicon-via (TSV). In one embodiment, the method comprises forming a TSV through a semiconductor substrate by forming a via in the substrate and forming a multitude of conductive bars in the via. These conductive bars include at least one signal bar, at least one power bar, and at least one ground bar. The method further comprises connecting the at least one power bar to a power voltage source to apply power through the TSV, connecting the at least one ground bar to a ground voltage, and connecting the at least one signal bar to a source of an electronic signal to conduct the signal through the TSV. In this way, the TSV and the conductive bars in the TSV form a hybrid power-ground-signal TSV in the semiconductor substrate.

In an embodiment, the one signal bar is located between the power bar and ground bar, whereby the power bar and the ground bar form an electric shield for the signal bar.

In one embodiment, the signal bar is located substantially mid-way between the power bar and the ground bar.

In one embodiment, a second signal bar is formed between the power bar and the ground bar.

In an embodiment, a multitude of TSVs are formed through the semiconductor structure. Each of the TSVs include a via in the substrate and a multitude of conductor bars in the via, and the conductor bars include at least one signal bar, at least one power bar, and at least one ground bar. Different ones of the TSVs are programmed for different uses, whereby the TSVs provide multiple capabilities in a limited number of structures.

In one embodiment, the power bars are connected to a common voltage source, the ground bars are connected to a common ground voltage, and the signal bar is substantially mid-way between the power bars and the ground bars.

Embodiments of the invention provide a hybrid TSV structure that utilizes multiple conductors to shield the signal structures for enhanced signal integrity performance, as well as to provide multiple power distribution network and ground return paths at the same time.

Embodiments of the invention address issues regarding TSV density, signal integrity and power delivery. In embodiments of the invention, the TSV is a hybrid interconnect structure that utilizes multiple vertical conductors to transmit high speed electrical signals while shielding and isolating noise coupling (TSV-to-TSV and TSV-to-device) for enhanced signal integrity performance, as well as to provide multiple power distribution network and ground return paths at the same time. For a fixed TSV pitch and chip area, embodiments of the invention enable higher TSV signal density with built-in noise shielding capability, power and ground paths, and therefore improve the 3D system design and integration.

BRIEF DESCRIPTION OF THE DRAWINGS

FIG. 7 illustrates full-wave electromagnetic models of hybrid TSVs for differential signaling in accordance with embodiments of the invention.

DETAILED DESCRIPTION

Figure 1:
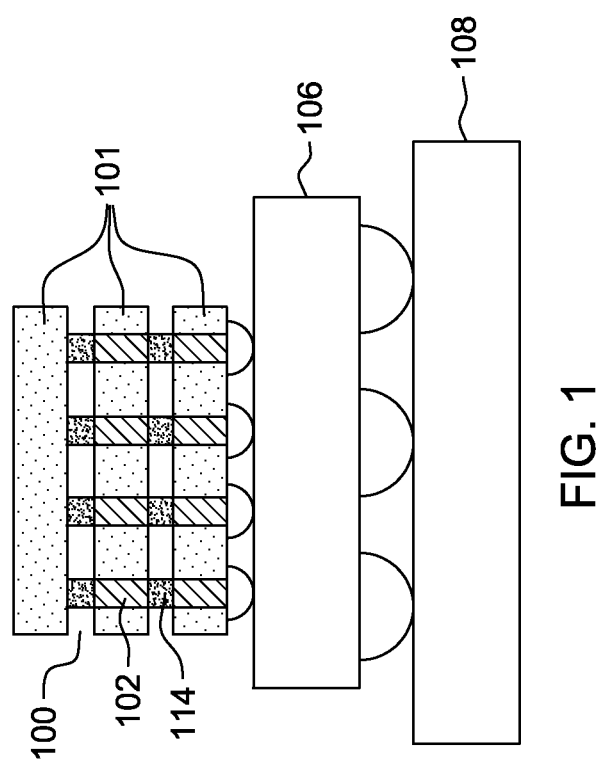
FIG. 1 is a diagram of an exemplary three dimensional integrated circuit having layers connected with through vias.

Embodiments of the invention provide a hybrid TSV structure that utilizes multiple conductors to shield the signal structures for enhanced signal integrity performance, as well as to provide multiple power distribution network and ground return paths at the same time. In recent years the development of three dimensional IC and silicon packaging (Si3D) has been proposed with through-silicon via (TSV) technology to enable the joining of multiple silicon chips and or wafers together that are mounted on a 2nd-level package.

A number of issues need to be addressed for three-dimensional IC and packaging design, including TSV density, TSV signal integrity, and the use of TSV for three-dimensional power delivery. TSV density is an important issue because three-dimensional IC and packaging structure increases the density of active circuits that can be integrated in a given space. More signal TSVs per area is also desired to meet fast-growing I/O bandwidth requirement.

TSV signal integrity is also a significant factor. There have been studies on various conductor configurations such as circular, angular, and bar conductors for different via processes (Z. Xu, et al., "High-Speed Design and Broadband Modeling of Through-Strata-Vias (TSVs) in 3D Integration", IEEE Transactions on Components, Packaging, and Manufacturing Technologies, Vol. 1, No. 2 pp. 154-163, February 2011). It has been observed in the hardware measurement that the insertion loss of TSV, which is partly due to the conductor configuration and geometrical dimension, has a strong effect on high-speed signals transmitting through the via (F. Doany, et al., "Terabit/s-Class 24-Channel Bidirectional Optical Transceiver Module Based on Si Carrier TSV for Board-Level Interconnects", Proc. IEEE Electronic Components and Technology Conference (ECTC), pp. 58-65, 2010). The TSV loss needs to be reduced in order to minimize signal attenuation and distortion, particularly when multiple chip stacking is present.

Moreover, simulations for near- and far-end coupling reveal significant cross talk for both a single ended and differential pair configuration (Z. Xu, et al., "Crosstalk Evaluation, Suppression and Modeling in 3D Through-Strata-Via (TSV) Network", Proc. IEEE 3D Systems Integration Conference (3DIC), pp. 1-8, 2010). Such coupling is more of a concern as TSV pitch scales further down in the future.

In addition, the coupling between TSV and active devices through silicon substrate can affect normal operation of noise sensitive circuitries detrimentally (J. Cho, et al., "Active Circuit to Through Silicon Via (TSV) Noise Coupling", Prof. IEEE Conference on Electrical Performance of Electronic Packaging and Systems (EPEPS), pp. 97-100, 2009). TSV shielding structures are required to prevent undesired TSV to device noise coupling. It has been proposed to apply a guard ring or additional ground TSVs as the shielding structures (J. Cho, et al., "Through Silicon Via (TSV) Shielding Structures", Prof. IEEE Conference on Electrical Performance of Electronic Packaging and Systems (EPEPS), pp. 269-272, 2010), (Jonghyun Cho, et al. "Modeling and Analysis of Through-Silicon Via (TSV) Noise Coupling and Suppression Using a Guard Ring", IEEE Transactions on Components, Packaging and Manufacturing Technology, pages 220-233, vol. 1, issue 2, February 2011). However, in order to achieve effective noise isolation, the proposed guard ring requires a large width of the ring, as well as a large separation distance between the TSV and the ring, which sacrifices active circuit area and reduces wiring flexibility near the TSV. Similarly, using ground vias to shield noise coupling would likely sacrifice the availability of other TSVs for routing signal and power.

Another important consideration is the use of TSV for three-dimensional power delivery. For a typical stack of multiple dies, e.g., memory or logic chips, a large number of TSVs are required for the formation of power distribution network with ground, in addition to the signaling nets (single-ended or differential). Therefore, the effective area useable for active components and I/O is reduced. Given a limited number of available TSVs, it is often challenging to trade off and balance the usage of signal, power and ground TSVs in a three-dimensional design.

FIG. 1 illustrates an exemplary three-dimensional integrated circuit (IC) 100 using TSVs. A three-dimensional die stack 100 is formed from a set of circuit layers 101. The circuit layers 101 may be formed from any suitable circuit material such as, e.g., silicon. TSVs 102 run through the circuit layers 101 and are formed from a conductive material such as a metal. By providing vias through the IC 100, TSVs 102 save significant amounts of wiring that would otherwise run to the edge of the circuit layer 101 to connect to adjoining circuit layers. Furthermore, such edge-wired circuits typically use an additional layer between circuit layers 101, and this additional layer is rendered entirely unnecessary by the TSVs 102. The circuit layers 101 of die stack 100 may be formed and joined by any suitable technique, including, for example, wafer-on-wafer bonding where circuit layers 101 are formed separately and then aligned and connected to one another. Other technologies for forming and joining the circuit layers 101 include, but are not limited to, die-on-wafer technologies and die-on-die technologies.

The die stack 100 rests on a package 106, which may be formed from, e.g., silicon, and which in turn rests on a base substrate 108. The package 106 may support multiple die stacks 100 and may provide interconnections between said die stacks 100 and the base substrate 108 and may integrate decoupling capacitors. In this way, a three-dimensional structure can be built using stacked integrated circuits and other types of circuits, all working through a common framework (the package 106). The substrate 108 provides mechanical support to the package 106 and provides an additional thermal interface to allow for cooling. The base substrate 108 may be formed from, for example, glass ceramic or low-temperature co-fired ceramic. The circuit layers 101 are connected by, for example, silicon-to-silicon interconnections 114.

Different from via structures on printed circuit boards (PCB) and packages in which vias are typically formed by mechanical or laser drilling, TSVs 102 may be formed in the circuit layers 101 by, for example, deep-silicon reactive ion etching to form holes through the circuit layers. Also, the TSVs may be formed with one of several cross sections; and for example, a TSV may have a cross section that is cylindrical, annular, coaxial, or rectangular. After etching, the hole in circuit layer 101 may be insulated using, for example, a thermal oxide substance such as silicon dioxide. A conductor may be applied in the TSV and may include, for example, copper, tungsten, or a composite. TSVs 102 may be formed by any appropriate process and may vary in size, for example, about 1-90 µm, and may be implemented on circuit layers 102 having a thickness of, for example, about 1-730 µm, with an exemplary thickness of 150 µm. TSVs 102 may be formed using, for example, 45 nm or 22 nm silicon-on-insulator processes or by any other suitable technology. A large number of TSVs 102 may be used on a single circuit layer 101, according to the needs of the given application. Processes for manufacturing semiconductor structures with through-substrate vias are disclosed, for example, in U.S. Patent Application Publication No. 2011/0108948, the disclosure of which is hereby incorporated herein by reference in its entirety.

Figure 2:
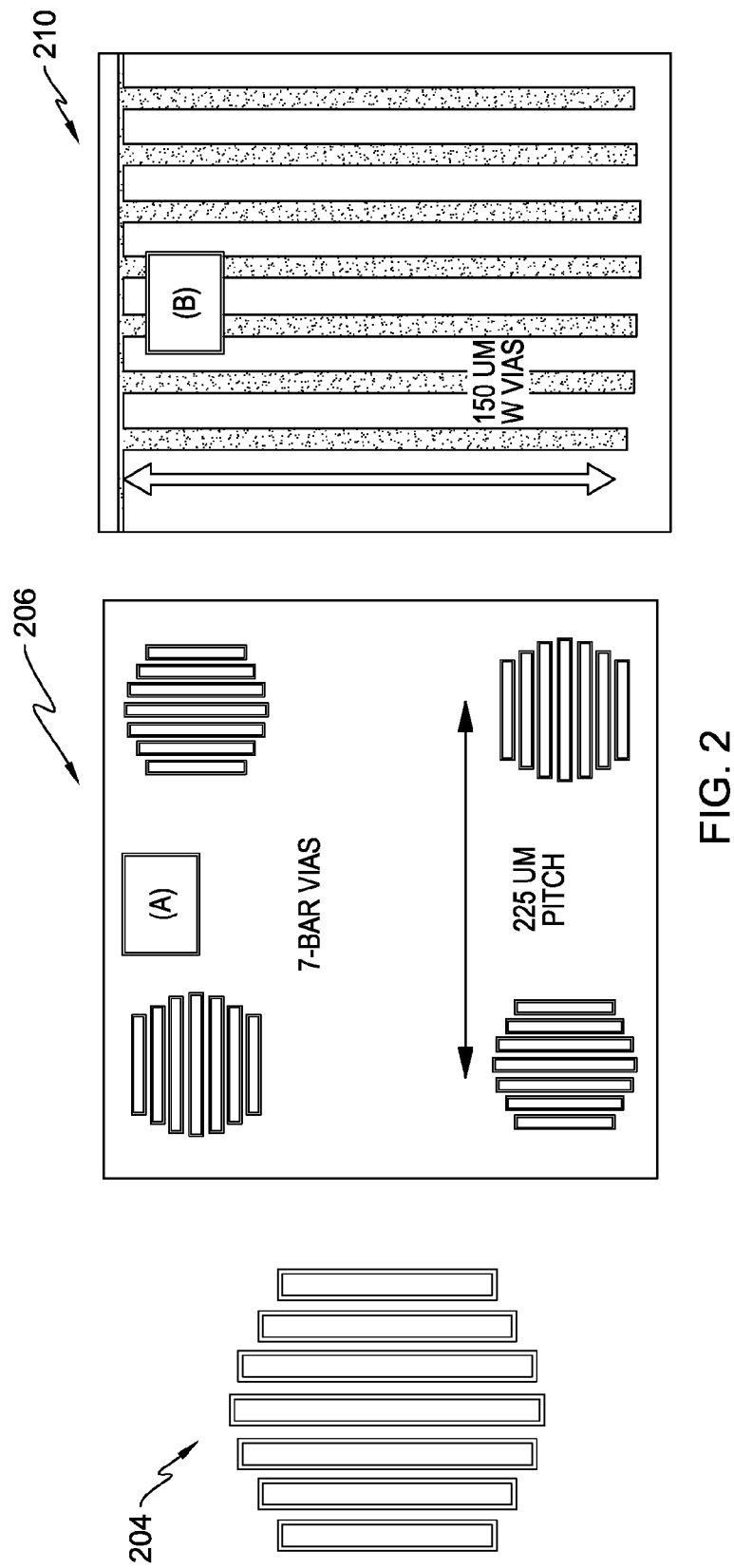
FIG. 2 illustrates a current tungsten-filled seven-bar tungsten TSV.

FIG. 2 shows a typical seven bar structure that forms a tungsten TSV (W-TSV) using CMOS technology. A conceptual top down view diagram of the TSV is shown at 204. Such a TSV is typically used for a single function, i.e., power, signal or ground. Typical bar dimensions are 3 µm×55-70 µm with a depth of about 150 µm. Following etch, the vias are insulated with, for example, a silicon dioxide (SiO2) layer and then metalized. Chemically vapor-deposited (CVD) tungsten may be used because of its ability to metalize high aspect ratio features. A top down optical image of a two-by-two TSV array showing the via pitch is illustrated at 206, and an SEM cross-section of a metalized TSV is shown at 210.

Figure 3:
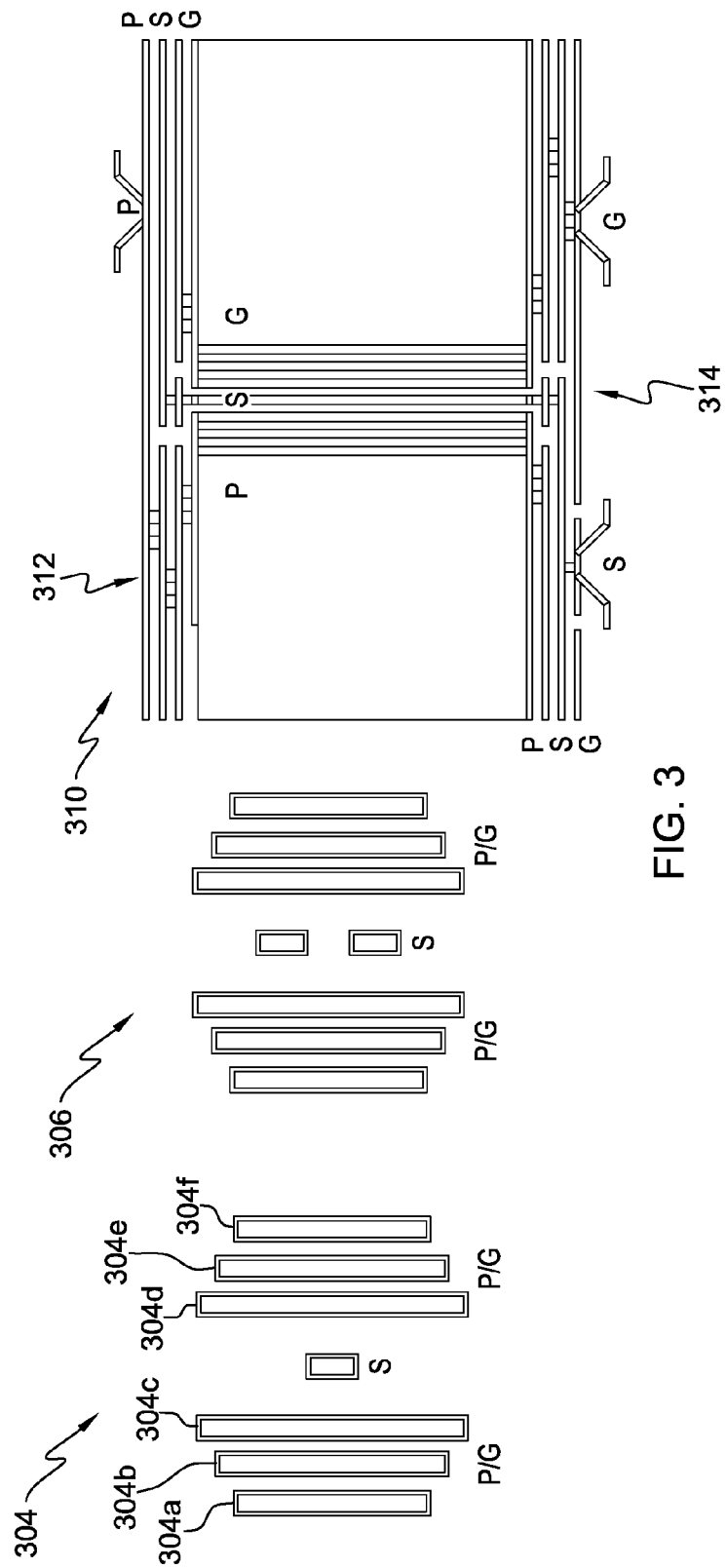
FIG. 3 shows a hybrid TSV in accordance with an embodiment of the invention.
Figure 4:
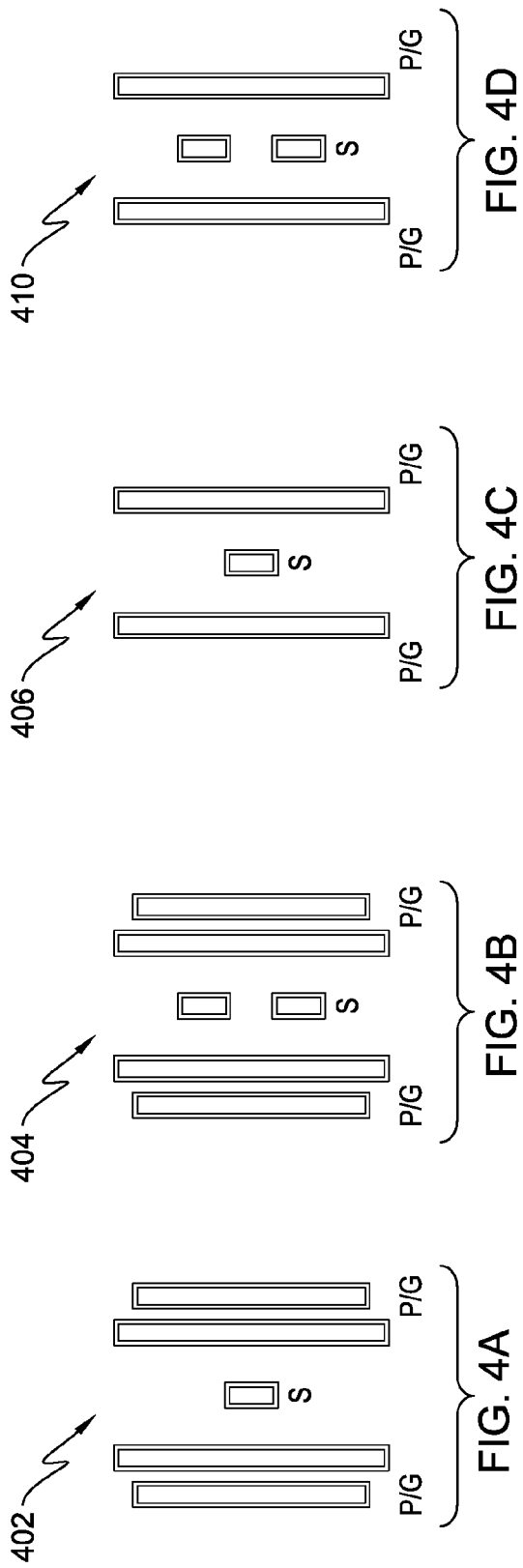
FIGS. 4A-4D depict several variations of a hybrid TSV design according to embodiments of the invention.

FIG. 3 illustrates a hybrid TSV, in accordance with an embodiment of the invention, which combines power, ground and signal in one via. A TSV with fully shielded single-ended signaling is shown at 304, and a TSV with fully shielded differential signaling is shown at 306. A cross-section view of a connecting hybrid TSV with front-end and back-end wiring is shown at 310. To form TSVs 304 and 306, a long center conductor in a seven-bar TSV is modified to be either a smaller single conductor or a pair of smaller conductors (for single-ended signaling 304 and differential signaling 306, respectively) so that a fully shielded signal path can be achieved. The dimensions of the center conductor(s) are optimized to achieve a target impedance value (e.g., 50Ω for single-ended signaling and 100Ω for differential signaling).

With the embodiments shown in FIG. 3, the outer three vertical conductors 304a, 304b, 304d, 304e and 304f on each side of the center conductor provide sufficient shielding to isolate noise coupling to other TSV and to any active device through the substrate. At the same time, the outer three conductors on the different sides can be committed to a different reference (i.e., power or ground) thus permitting a feed/return structure for the power distribution network. The cross sectional arrangement shown at 310 indicates the construction of a signal with two different references (one power, one ground) adjacent to each other. In embodiments of the invention, the outer three conductors on the different sides of the center conductor can be wired separately in a group through front-end layers 312 and back-end layers 314 to further connect with a global power delivery network and a ground return path.

FIGS. 4A-4D show different design variant of the hybrid TSV. According to embodiments of the invention, a five-bar single-ended TSV is shown at 402, and a five-bar differential TSV is illustrated at 404. A three-bar single-ended TSV is shown at 406, and a three-bar differential TSV is illustrated at 410. The same principles discussed above in connection with TSVs of FIG. 3 can be applied to TSVs with a different number of tungsten-filled bars, for example, 3 or 5. In each case, the outer conductors can serve as a reference to deliver power or ground return, and at the same time provide full shielding to the signals transmitted over the central conductor or conductors to isolate its coupling to other TSVs and active devices.

Figure 5:
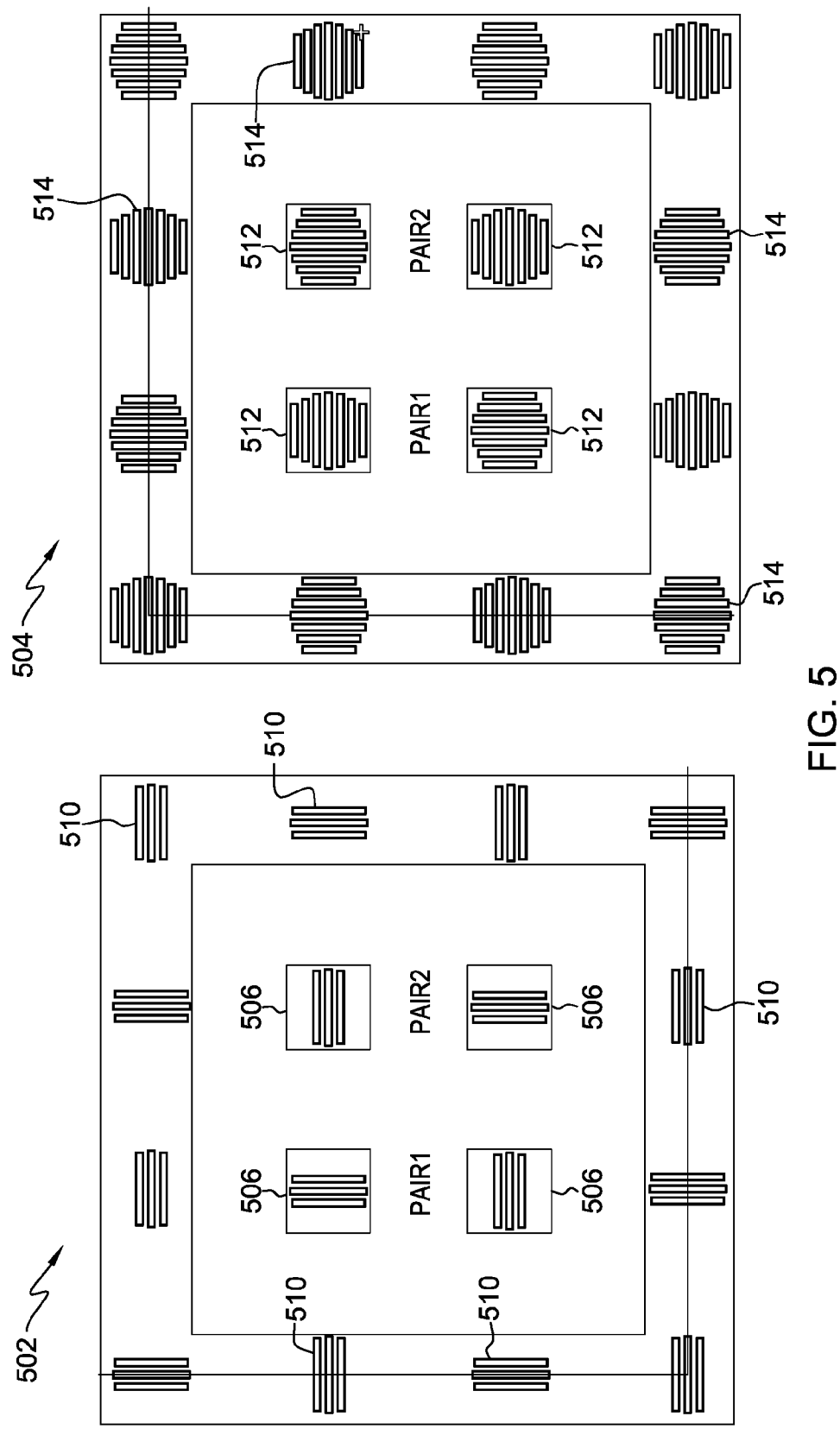
FIG. 5 is a top view of full-wave electromagnetic models for a group of TSV pairs.

FIG. 5 illustrates top views 502 and 504 of full-wave electromagnetic models for two differential signaling TSV pairs based on existing W-TSV technology. The view at 502 shows two pairs of three-bar TSVs 506 next to each other with surrounding ground TSVs 510. The view at 504 shows two pairs of seven-bar TSVs 512 next to each other with surrounding ground TSVs 514. The following design parameters are assumed in the simulation: TSV height=90 um, TSV pitch=200 um, TSV silicon dioxide liner thickness=0.5 um, Si substrate conductivity=7.4 S/m. Adjacent TSVs are rotated by 90 degree relative to each other in accordance with the manufacturing process requirement.

Figure 6A:
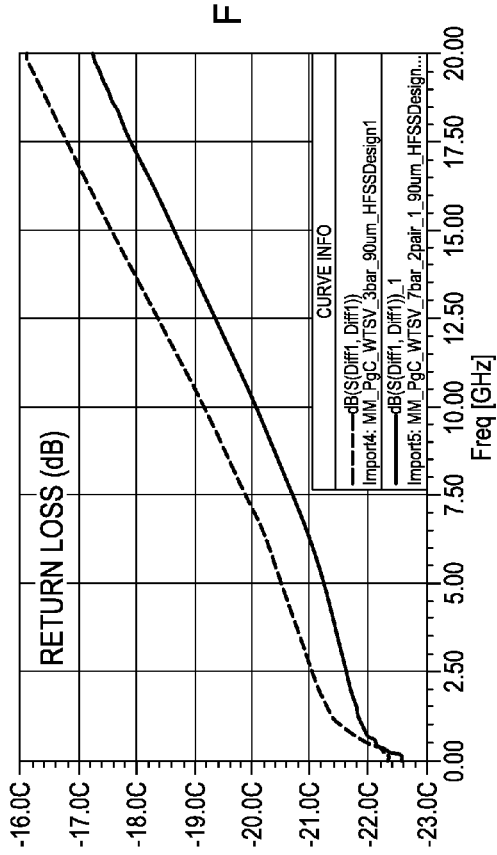
FIGS. 6A and 6B show graphs illustrating simulated return and insertion losses for the TSV of FIG. 5.
Figure 6B:
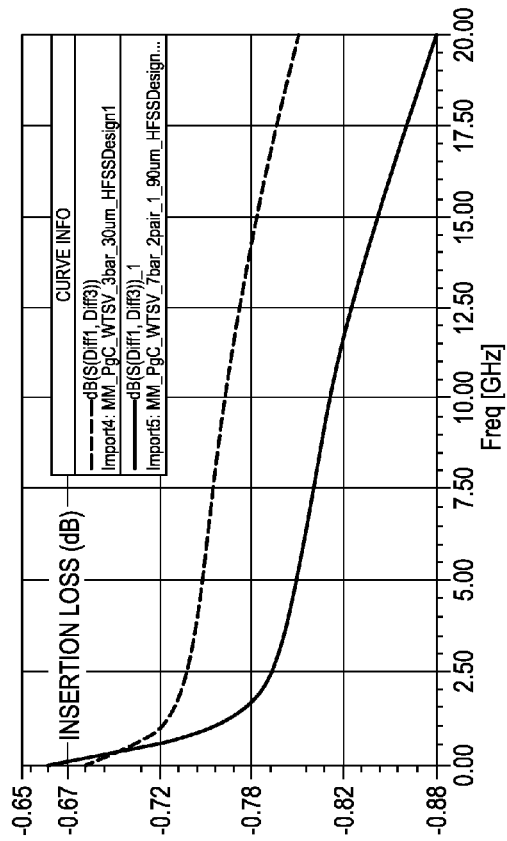
Figure 6C:
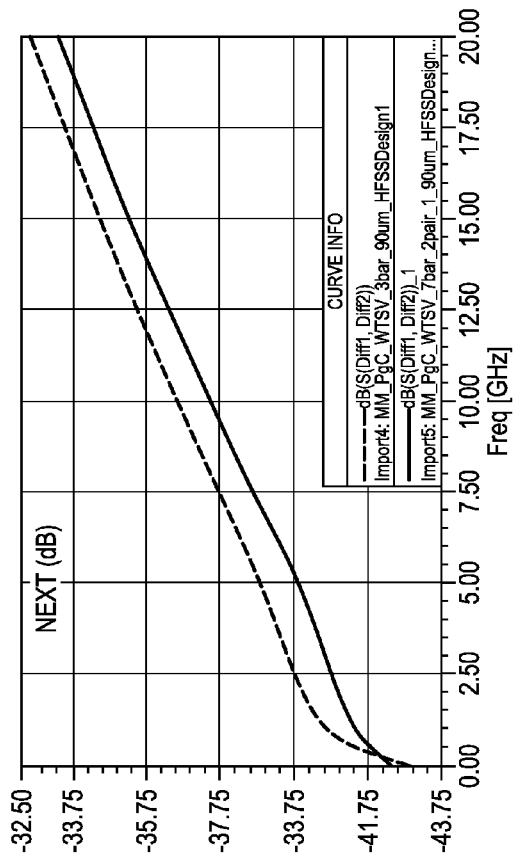
FIGS. 6C and 6D show graphs that illustrate simulated near-end and far-end cross talk for the TSV pairs of FIG. 5.
Figure 6D:
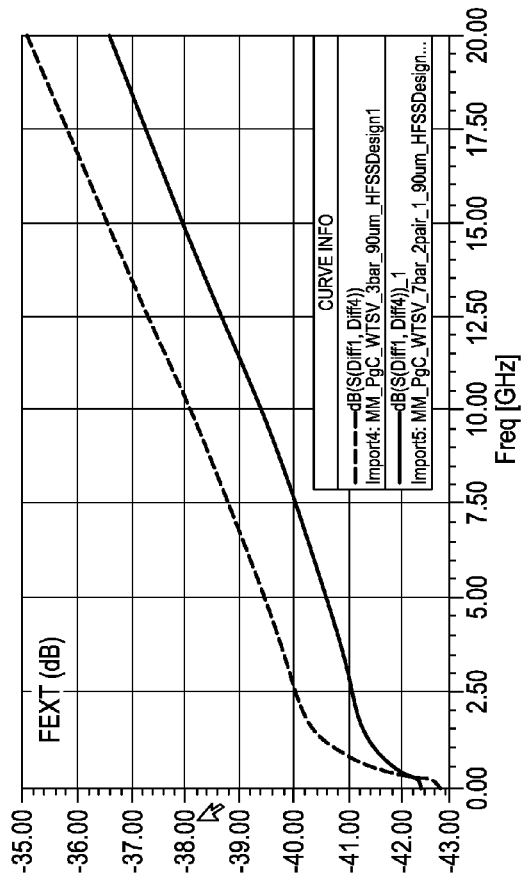

FIGS. 6A and 6B show the simulated return loss and insertion loss of one TSV pair of each of the views 502 and 504, and FIGS. 6C and 6D show near-end and far-end cross talk between the two TSV pairs of each of the views 502 and 504.

The 3-bar W-TSV 506 exhibits lower loss than the 7-bar W-TSVs 512 mainly due to the smaller silicon dioxide liner capacitance which depends on the cross sectional area of the signal conductors. At 10 GHz, the insertion losses are approximately 0.76 dB and 0.81 dB for the 3-bar W-TSV and the 7-bar W-TSV, respectively. For signal coupling, both near-end and far-end crosstalk show approximately between −36 dB and −40 dB coupling for the two types of W-TSV.

FIG. 7 illustrates the full-wave electromagnetic models of hybrid TSVs 702, 704, 706 for differential signaling according to embodiments of the invention. The same material properties and geometrical parameters as those discussed above in connection with FIG. 5 are considered in the models of FIG. 7, namely, TSV height=90 um, TSV pitch=200 um, TSV silicon dioxide liner thickness=0.5 um, Si substrate conductivity=7.4 S/m. The simulated loss and crosstalk are compared with the previous models of FIG. 5 to demonstrate superior signal integrity performance for the hybrid TSVs of FIG. 7.

Figure 8B:
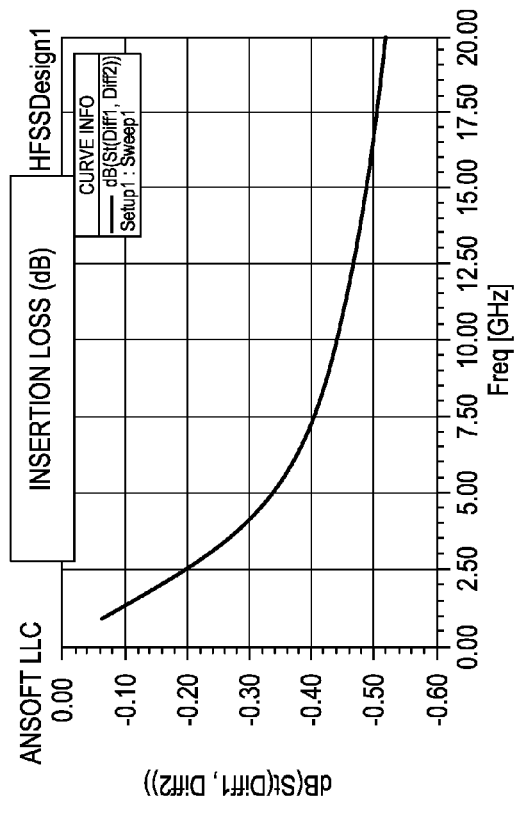
FIGS. 8A and 8B show graphs illustrating simulated return and insertion losses for the hybrid TSVs of FIG. 7.
Figure 8A:
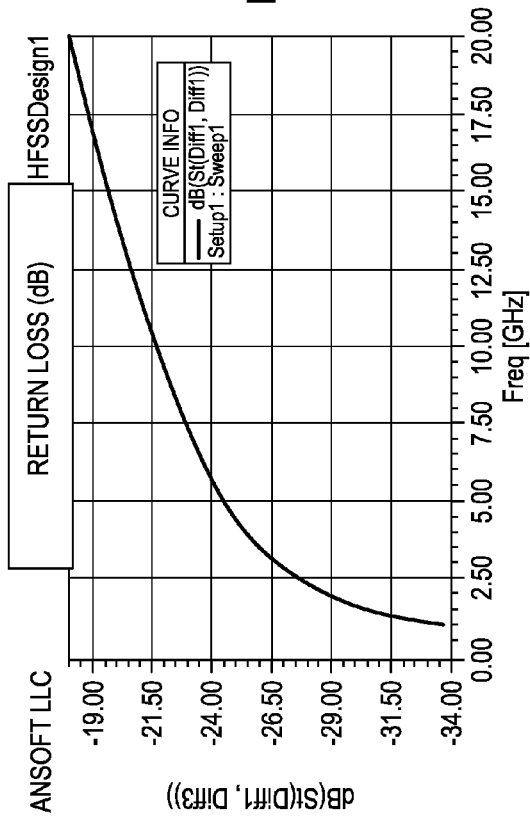
Figure 8D:
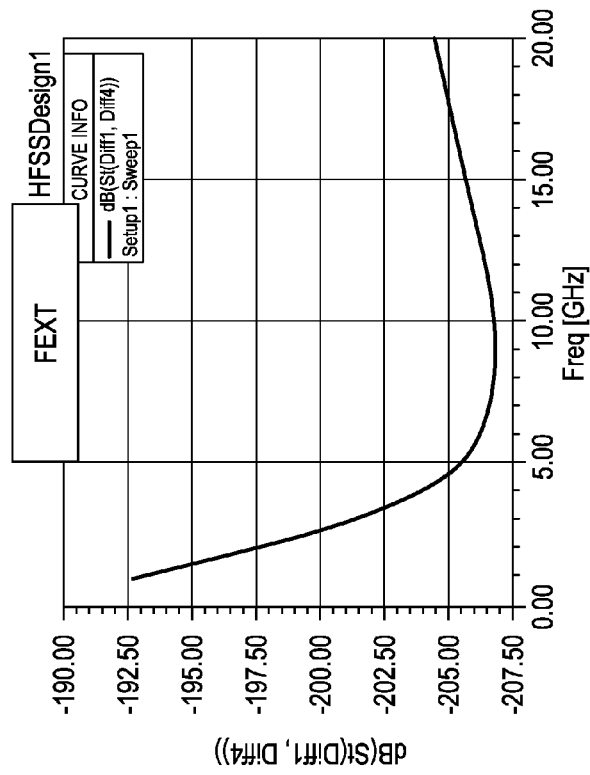
FIGS. 8C and 8D show graphs that illustrate simulated near-end and far-end cross talk for the hybrid TSVs of FIG. 7.
Figure 8C:
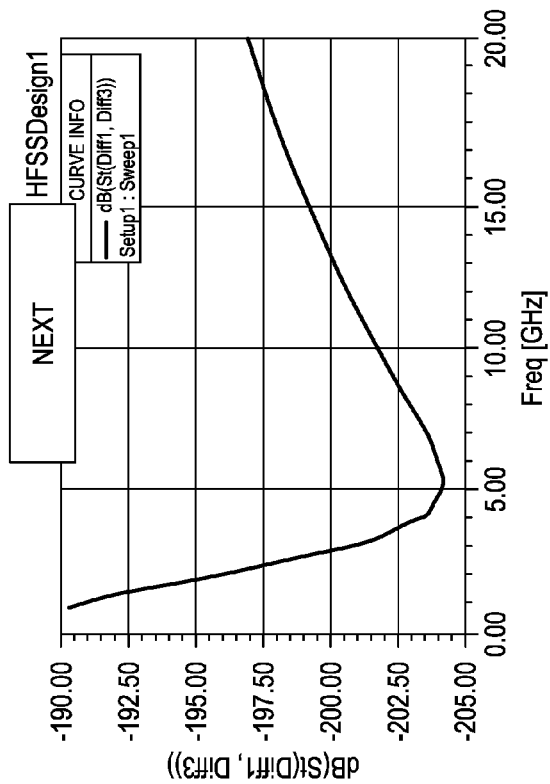

FIGS. 8A and 8B show the simulated return loss and insertion loss of one of the hybrid TSVs 702 of FIG. 7, and FIGS. 8C and 8D show near-end and far-end cross talk between the two hybrid TSVs 704, 706 of FIG. 7. The hybrid W-TSV 702 exhibits lower loss than the previous 3-bar and 7-bar W-TSVs of FIG. 5. At 10 GHz, the insertion loss of the hybrid TSV of FIG. 7 is approximately 0.45 dB. In addition, with the embodiments of the TSVs shown in FIG. 7, as the outer conductor provides sufficient ground shielding, the electric field generated by the currents flowing on the center signal conductors is well confined inside the via. Very little field leaks out and gets coupled to a neighbor TSV (or any active device) through silicon substrate. On the crosstalk plots shown in FIG. 8, there is virtually no coupling between the two hybrid TSVs 704, 706 of FIG. 7—the cross talk level shown, i.e., −190 dB, is negligibly small and is subject to numerical errors given by the full-wave solver.

With embodiments of the, only two hybrid TSVs are required to implement two channels of differential signaling (plus power and ground) with superior signal integrity performance (i.e., lower loss and smaller cross talk). As comparison, the existing TSV technology shown in FIGS. 6 and 7 requires a minimum of four TSVs to implement the same number of signaling channels. The additional TSVs are needed to include ground and power.

The description of the present invention has been presented for purposes of illustration and description, and is not intended to be exhaustive or to limit the invention in the form disclosed. Many modifications and variations will be apparent to those of ordinary skill in the art without departing from the scope of the invention. The embodiments were chosen and described in order to explain the principles and application of the invention, and to enable others of ordinary skill in the art to understand the invention. The invention may be implemented in various embodiments with various modifications as are suited to the particular use contemplated.

What is claimed is:

1. A method of providing signal, power and ground through a through-silicon-via (TSV), the method comprising:
    forming a TSV through a semiconductor substrate, including forming a via in the substrate; and forming a multitude of conductive bars in the via, said multitude of bars including at least one signal bar, at least one power bar, and at least one ground bar to combine signal, power and ground in one TSV, and including forming the power and ground bars on opposite sides of the signal bar in said one TSV;

connecting the at least one power bar to a power voltage source to apply power through the TSV;

connecting the at least one ground bar to a ground voltage; and connecting the at least one signal bar to a source of an electronic signal to conduct the signal through the TSV and to form a hybrid power-ground-signal TSV in the substrate.

2. The method according to claim 1, wherein the at least one signal bar is located between the at least one power bar and the at least one ground bars whereby the at least one power bar and the at least one ground bar form an electric shield for the at least one signal bar.

3. The method according to claim 1, wherein the signal bar is located substantially mid-way between the at least one power bar and the at least one ground bar.

4. The method according to claim 1, wherein the forming a multitude of conductor bars includes forming a second signal bar between the at least one power bar and the at least one ground bar.

5. The method according to claim 1, wherein:

the forming a TSV through a semiconductor substrate includes forming a multitude of TSVs through the semiconductor structure, each of the TSVs including a via in the substrate, and a multitude of conductor bars in the via, said multitude of conductor bars including at least one signal bar, at least one power bar, and at least one ground bar; and the method further comprises programming different ones of the TSVs for different uses, whereby the TSVs provide multiple capabilities in a limited number of TSV structures.

6. The method according to claim 1, wherein said multitude of conductive bars, include a plurality of power bars on a first side of the at least one signal bar.

7. The method according to claim 6, wherein the multitude of conductive bars further includes a plurality of ground bars on a second side of the at least one signal bar.

8. The method according to claim 7, wherein the connecting the at least one power bar includes connecting said plurality of power bars to a common voltage source.

9. The method according to claim 8, wherein the connecting the at least one ground bar includes connecting said plurality of ground bars to a common ground voltage.

10. The method according to claim 9, wherein the at least one signal bar is substantially mid-way between the plurality of power bars and the plurality of ground bars.

\* \* \* \* \*